(12) United States Patent
Kobayashi

(10) Patent No.: US 12,519,465 B2
(45) Date of Patent: Jan. 6, 2026

(54) SYSTEMS AND METHODS FOR GATE CURRENT SHAPING FOR GATE DRIVERS

(71) Applicant: Renesas Electronics Corporation, Tokyo (JP)

(72) Inventor: Daisuke Kobayashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 60 days.

(21) Appl. No.: 18/524,695

(22) Filed: Nov. 30, 2023

(65) Prior Publication Data

US 2025/0183888 A1    Jun. 5, 2025

(51) Int. Cl.
*H03K 17/16* (2006.01)
*H02M 1/00* (2006.01)
*H02M 1/08* (2006.01)

(52) U.S. Cl.
CPC ........ *H03K 17/165* (2013.01); *H02M 1/0054* (2021.05); *H02M 1/08* (2013.01)

(58) Field of Classification Search
None
See application file for complete search history.

(56) References Cited

U.S. PATENT DOCUMENTS

| | | | |
|---|---|---|---|
| 5,949,259 A * | 9/1999 | Garcia | H03K 19/00361 326/26 |
| 6,914,457 B2 * | 7/2005 | Confalonieri | H03K 17/164 327/108 |
| 7,190,225 B2 * | 3/2007 | Edwards | H03F 3/45183 330/264 |
| 9,473,127 B1 * | 10/2016 | Azin | H03K 19/0016 |
| 10,938,381 B1 * | 3/2021 | Jiang | H03K 17/166 |
| 12,028,073 B2 * | 7/2024 | Nishimura | H03K 17/6871 |

* cited by examiner

*Primary Examiner* — Jeffrey S Zweizig
(74) *Attorney, Agent, or Firm* — SCULLY, SCOTT, MURPHY & PRESSER, P.C.

(57) ABSTRACT

Gate drivers, systems and methods are described. A gate driver can generate a gate current for driving a power switch in a system. A circuit can define a waveform shape of the gate current. The defined waveform shape of the gate current can cause a current of the power switch to have a constant slew rate.

9 Claims, 24 Drawing Sheets

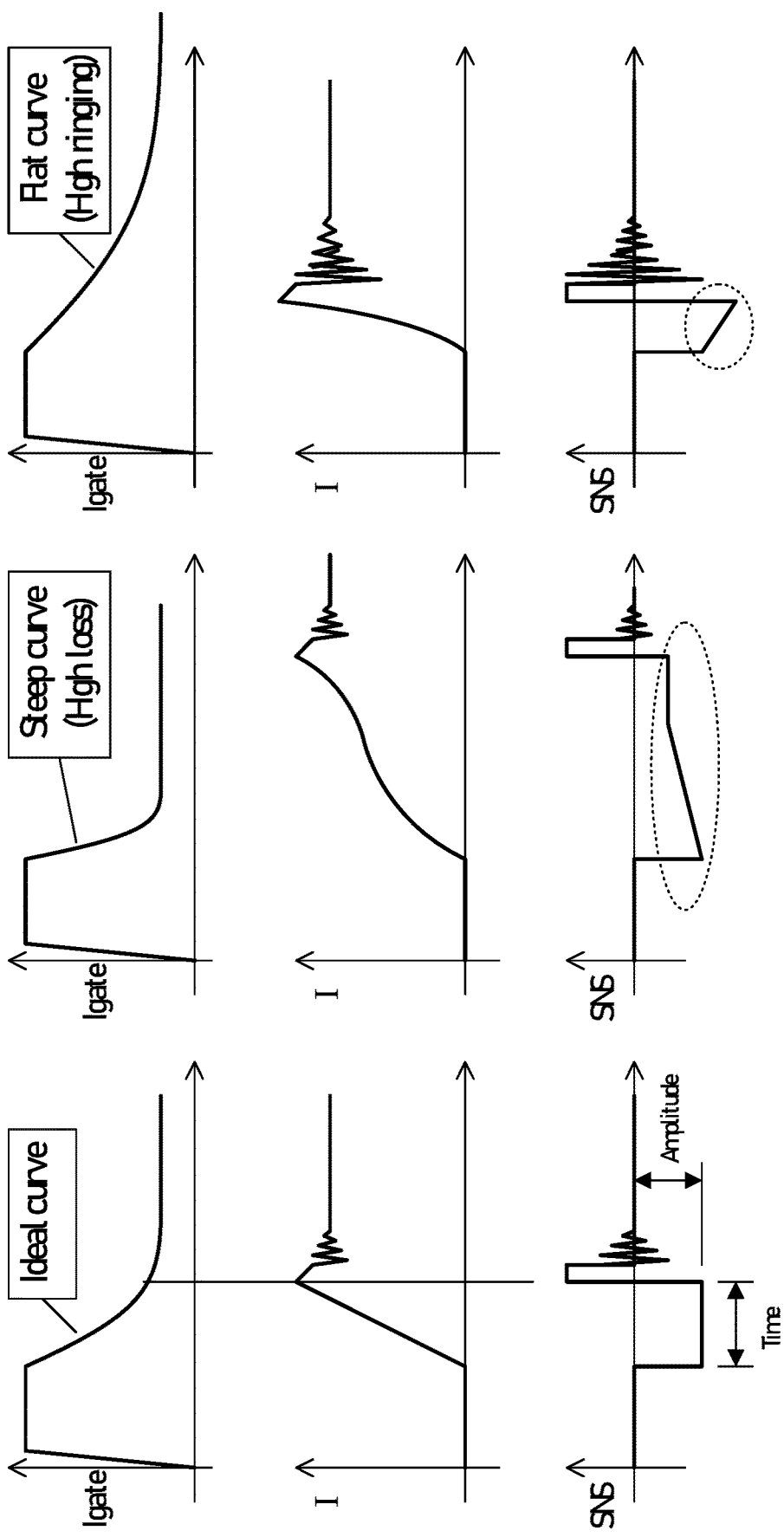

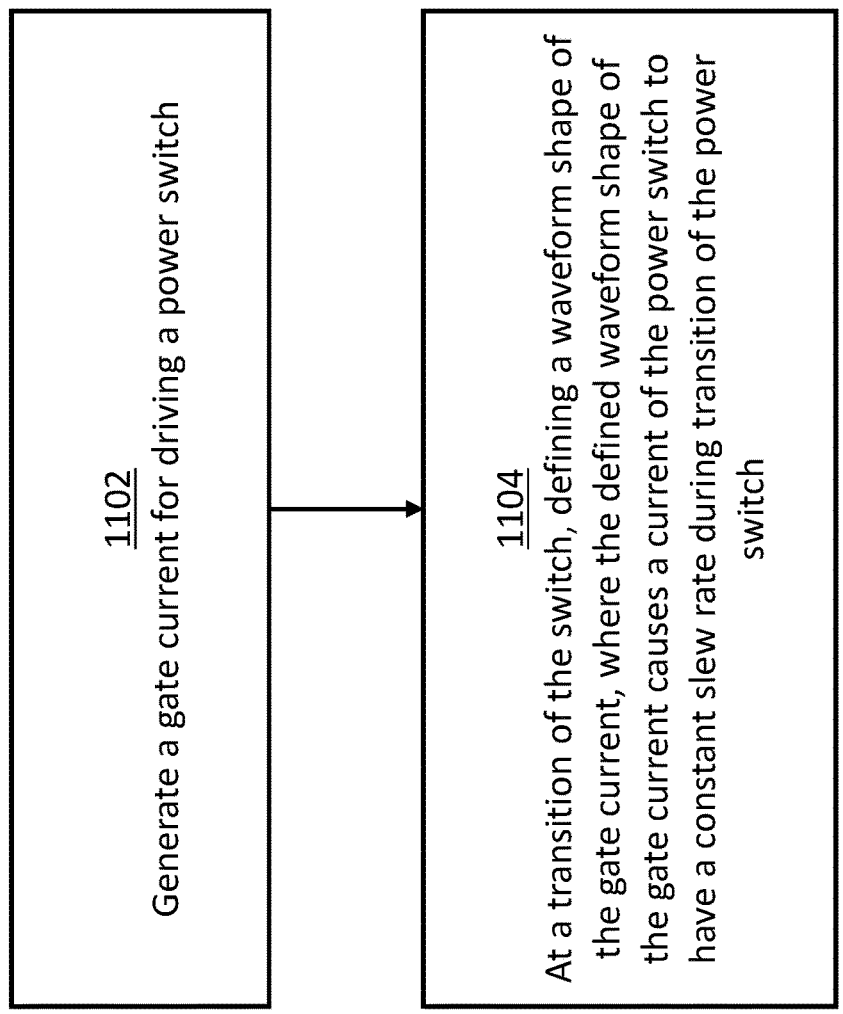

SYSTEMS AND METHODS FOR GATE CURRENT SHAPING FOR GATE DRIVERS

BACKGROUND OF THE SPECIFICATION

The present disclosure relates in general to semiconductor devices. More specifically, the present disclosure relates to a gate current shaping for gate drivers to reduce switching loss and ringing.

Gate drivers are used in switching converter applications such as DC/DC converters, inverters, motor drivers, etc. These system can include a controller, one or more power switches and gate drivers for each switches. The gate drivers drive its power switch to on state and off state according to the controller's signal and the system provides required output voltage or power to the load.

SUMMARY

In one embodiment, a semiconductor device is generally described. The semiconductor device can include a driver circuit configured to drive a switch. The semiconductor device can further include a circuit configured to, at a transition of the switch, generate a gate current having a defined waveform shape. The defined waveform shape of the gate current can cause a current of the switch to have a constant slew rate during transition of the switch.

In one embodiment, a system in a switching converter is generally described. The system can include at least one power switch and a gate driver. The gate driver can be configured to drive the at least one power switch. The gate driver can be further configured to, at a transition of the at least one power switch, generate a gate current having a defined waveform shape. The defined waveform shape of the gate current causes a current of the switch to have a constant slew rate during transition of the at least one power switch.

In one embodiment, a method for operating a switching converter is generally described. The method can include generating a gate current for driving a switch in a switching converter. The method can further include defining a waveform shape of the gate current. The defined waveform shape of the gate current can cause a current of the power switch to have a constant slew rate during transition of the power switch.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 9A is a diagram showing an implementation of feedback control in one embodiment.

FIG. 9B is a diagram showing an implementation of feedback control in one embodiment.

FIG. 9C is a diagram showing an implementation of feedback control in one embodiment.

FIG. 11 illustrates a flow diagram of a process to implement gate current shaping for gate drivers in one embodiment.

DETAILED DESCRIPTION

In the following description, numerous specific details are set forth, such as particular structures, components, materials, dimensions, processing steps and techniques, to provide an understanding of the various embodiments of the present application. However, it will be appreciated by one of ordinary skill in the art that the various embodiments of the present application may be practiced without these specific details. In other instances, well-known structures or processing steps have not been described in detail to avoid obscuring the present application.

Figure 1A:
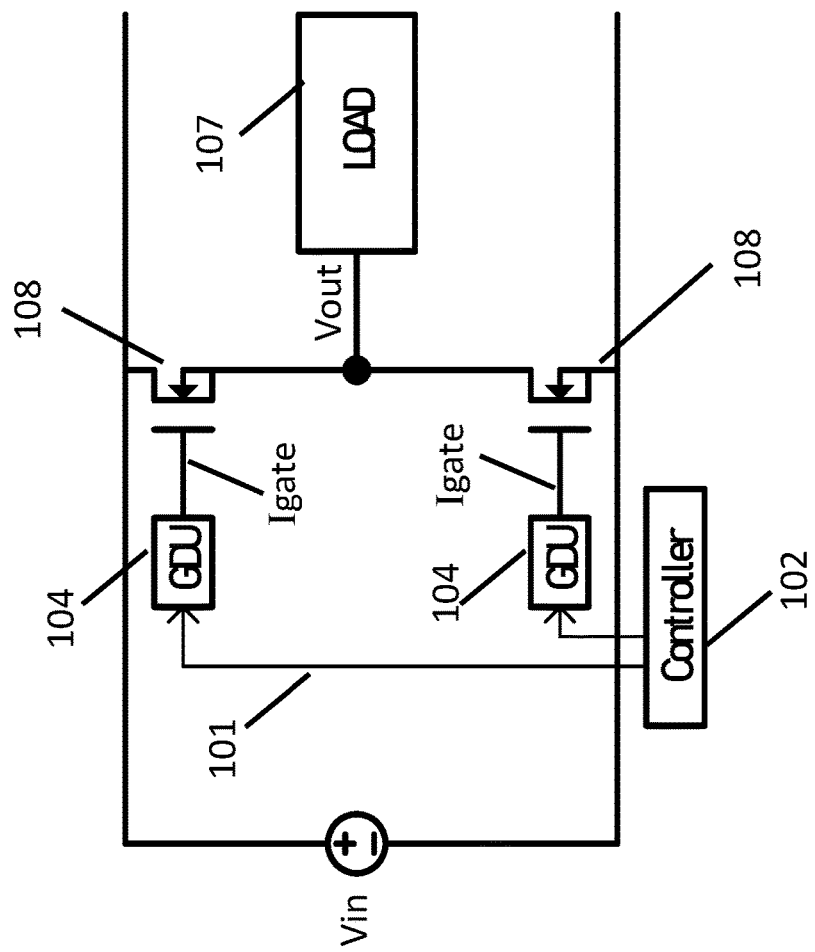
FIG. 1A is a diagram showing a system that can implement gate current shaping for gate drivers in one embodiment.

FIG. 1A is a diagram showing a system 100 that can implement gate current shaping for gate drivers in one embodiment. An application of system 100 can include, but not limited to, solenoid drivers, buck converters, boost converters, etc. System 100 can include at least a controller 102, one or more power switches 108 and gate drivers 104 (e.g., gate driver circuit) for each power switch among the one or more power switches 108. Each one of the gate drivers 104 can be configured to use a gate current Igate to drive a corresponding power switch among power switches 108 to on state or off state. Gate drivers 104 can generate the gate current Igate according to a signal 101 (e.g., pulse width modulation (PWM) signal or pulse frequency modulation (PFM) signal) provided by controller 102. System 100 can convert an input voltage Vin into an output voltage Vout or power to the load 107, where output voltage Vout can provide an amount of power required or demanded by load 107. System 100 shown in in FIG. 1 can be a buck converter where output voltage Vout is less than input voltage Vin. In one embodiment, power switches 108 can be field-effect transistors (FETs) such as metal oxide semiconductor field effect transistors (MOSFETs). In other embodiments, power switches 108 can be insulated-gate bipolar transistors (IGBTs). To be described in more detail below, gate drivers 104 can include components and circuitry configured to control a shape of gate current Igate being used for driving power switches 108. The control of the shape of gate current Igate can address ringing created by power switches 108.

Figure 1B:
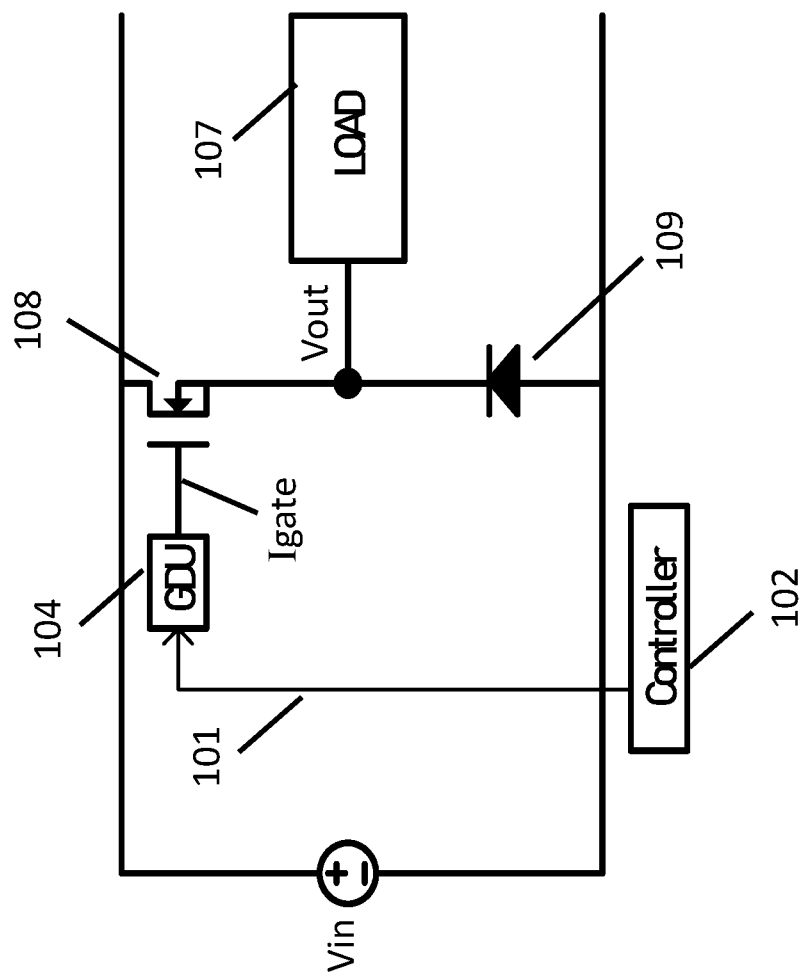
FIG. 1B is a diagram showing another system that can implement gate current shaping for gate drivers in one embodiment.

FIG. 1B is a diagram showing another system 110 that can implement gate current shaping for gate drivers in one embodiment. In system 110, gate drivers 104 can include one gate driver for driving one power switch 108, and system 110 can include a diode 109. The gate driver 104 shown in FIG. 1B can include components and circuitry configured to control a shape of gate current Igate being used for driving power switch 108 in FIG. 1B. The control of the shape of gate current Igate can address ringing created by power switch 108.

Figure 1C:
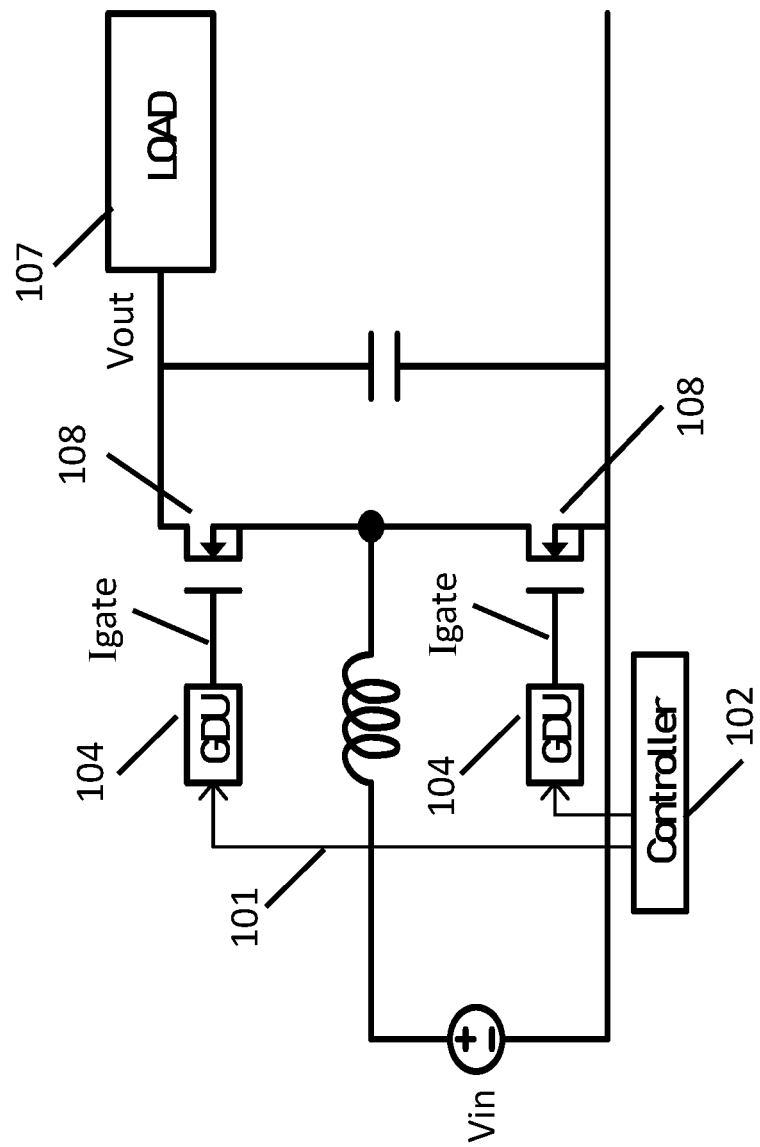
FIG. 1C is a diagram showing another system that can implement gate current shaping for gate drivers in one embodiment.
Figure 1D:
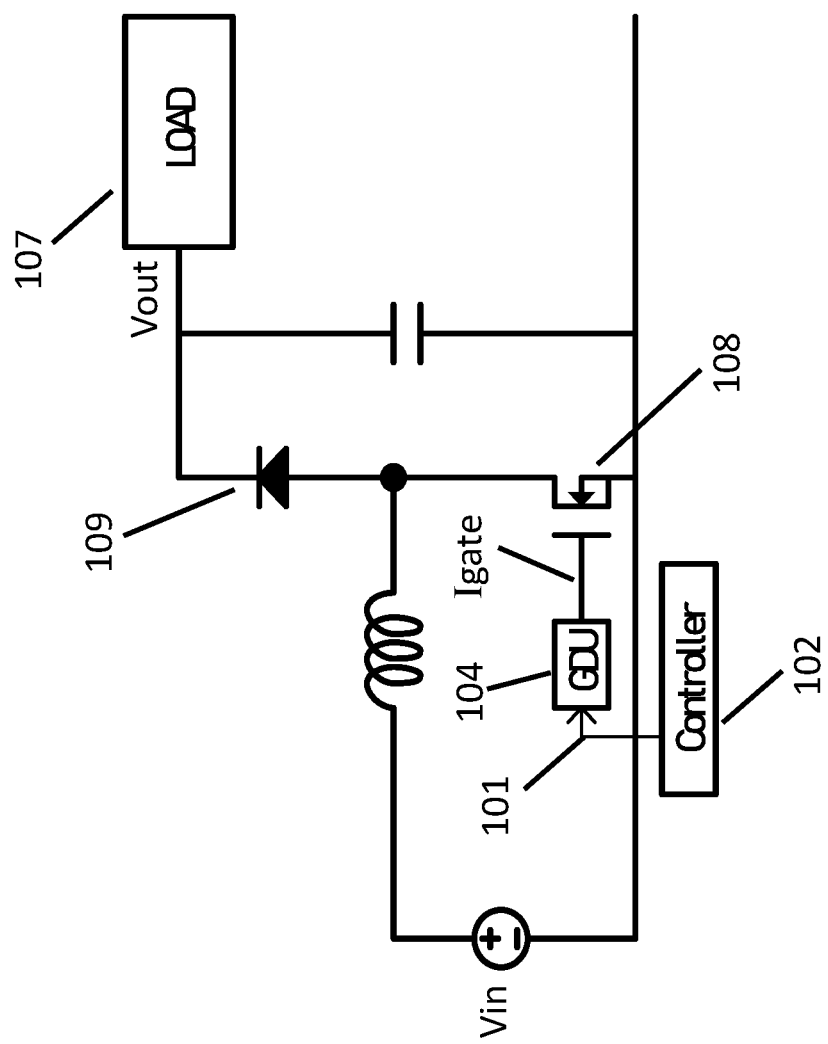
FIG. 1D is a diagram showing another system that can implement gate current shaping for gate drivers in one embodiment.

FIG. 1C is a diagram showing another system 120 that can implement gate current shaping for gate drivers in one embodiment. System 120 can be a boost converter where output voltage Vout is greater than input voltage Vin. The gate drivers 104 shown in FIG. 1C can include components and circuitry configured to control a shape of gate current Igate being used for driving power switches 108 in FIG. 1C.The control of the shape of gate current Igate can address ringing created by power switches 108. FIG. 1D is a diagram showing another system 130 that can implement gate current shaping for gate drivers in one embodiment. System 130 can be a power factor correction (PFC) converter. The gate driver 104 shown in FIG. 1D can include components and circuitry configured to control a shape of gate current Igate being used for driving power switch 108 in FIG. 1D. The control of the shape of gate current Igate can address ringing created by power switch 108.

Figure 1E:
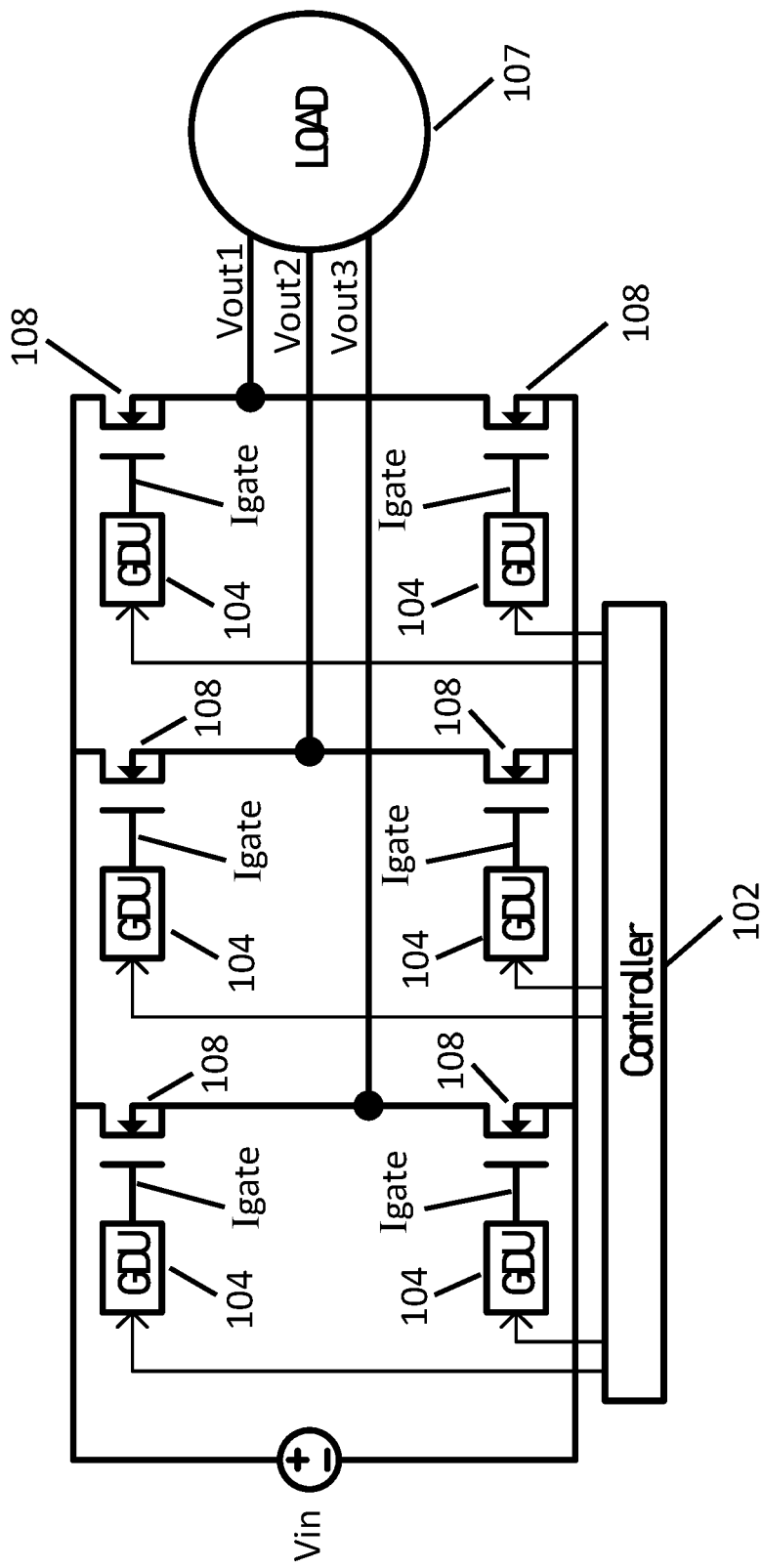
FIG. 1E is a diagram showing another system that can implement gate current shaping for gate drivers in one embodiment.

FIG. 1E is a diagram showing another system 140 that can implement gate current shaping for gate drivers in one embodiment. System 140 can be a part of inverters, motor drivers, multiphase DC/DC converters, etc. The gate drivers 104 shown in FIG. 1E can include components and circuitry configured to control a shape of gate current Igate being used for driving power switches 108 in FIG. 1E. The control of the shape of gate current Igate can address ringing created by power switches 108.

Figures 2A, 2B, 2C:
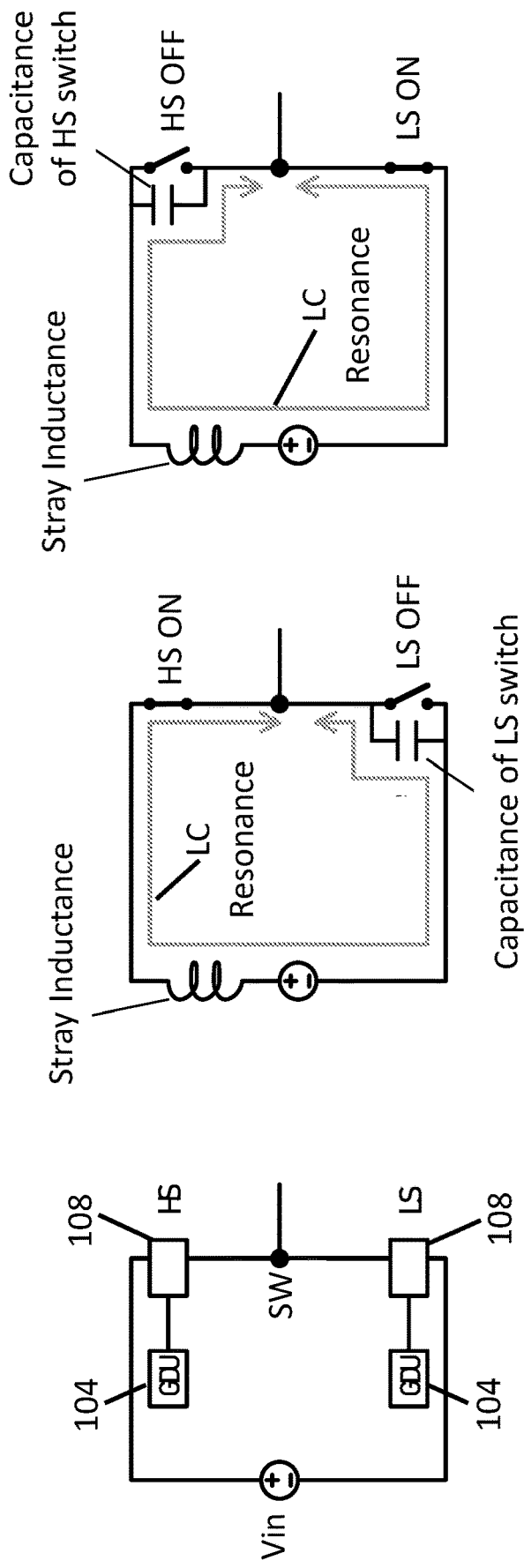
FIG. 2A is a diagram illustrating operation of power switches that can cause ringing.
FIG. 2B is another diagram illustrating operation of power switches that can cause ringing.
FIG. 2C is another diagram illustrating operation of power switches that can cause ringing.
Figure 2D:
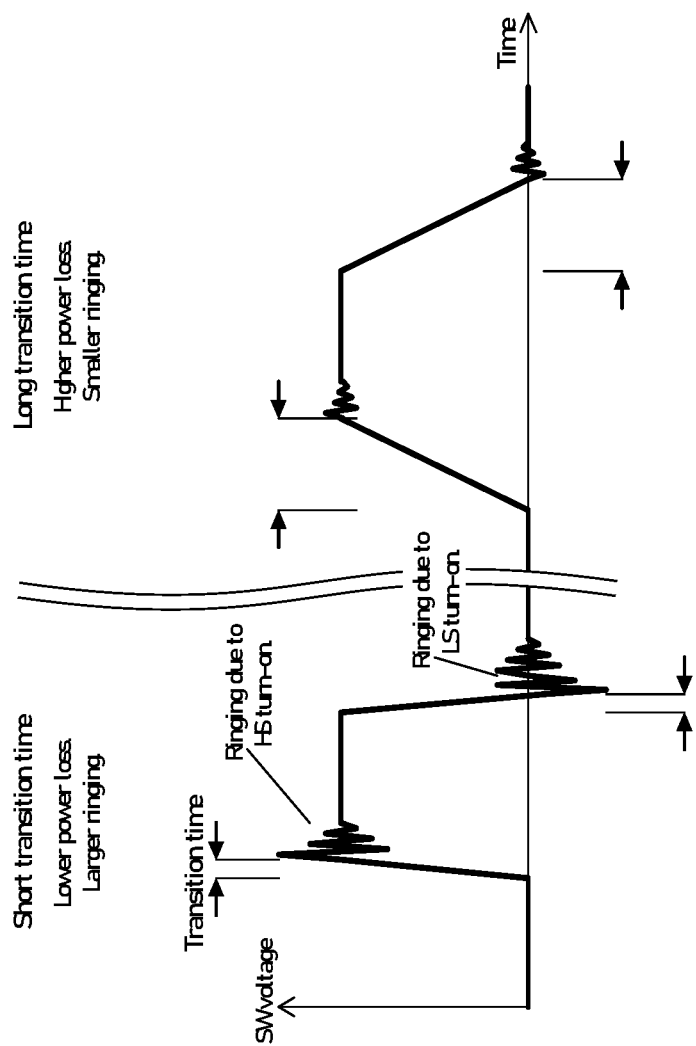
FIG. 2D is a diagram illustrating ringing that can occur from operation of power switches.

FIG. 2A to FIG. 2C are diagrams illustrating operation of power switches that can cause ringing. In FIG. 2A, a switching node SW between two power switches 108 (labeled as HS switch and LS switch) can operate in two states alternatively. A first state of SW is shown in FIG. 2B, where HS is turned on ON and LS is turned OFF. A second state of SW is shown in FIG. 2C, where HS is turned OFF and LS is turned ON. In embodiments where one power switch 108 is implemented with diode 109 (see FIG. 1B and FIG. 1D), an ON state of diode 109 means that diode 109 is forward conducting. As shown in FIG. 2B and FIG. 2C, LC resonance can be present due to stray inductance and capacitance. The LC resonance is observed as ringing in the current or the voltage as shown in FIG. 2D below. The ringing amplitude depends on multiple factors, such as transition time as shown in FIG. 2D.

FIG. 2D is a diagram illustrating ringing that can occur from operation of power switches. In an aspect, large ringing can damage power switches 108 by over voltage. Also, ringing can cause systems including power switches 108 (e.g., see FIG. 1A to FIG. 1E) to emit unwanted radio frequency noise such as electromagnetic interference (EMI). Hence, it is desirable to reduce ringing. However, there is a trade-off between the ringing and energy loss. If driver 104 drives HS and LS at a relatively faster rate, an efficiency of system 100 can increase, hence reducing loss, but ringing can increase. If gate driver 104 drives HS and LS at a relatively slower rate, an efficiency of system can decrease, hence increasing loss, but ringing can be reduced. To be described in more detail below, gate drivers 104 can include components and circuitry configured to control a shape of gate current Igate being used for driving power switches 108, such as HS and LS, to reduce ringing created by operation of power switches 108.

Figure 3B:
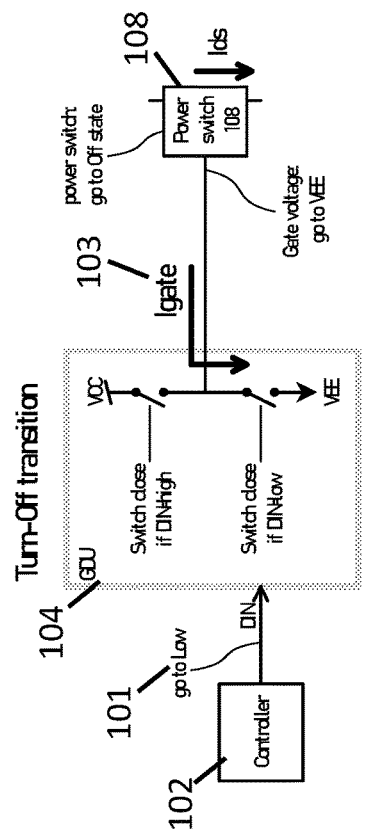
FIG. 3B is another diagram showing operations of power switches during transitions between on and off states.
Figure 3A:
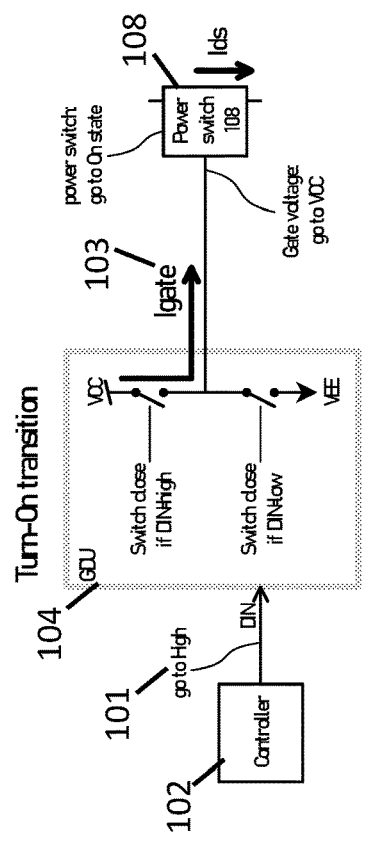
FIG. 3A is a diagram showing operations of power switches during transitions between on and off states.

FIG. 3A and FIG. 3B are diagrams showing operations of power switches during transitions between on and off states. Gate driver 104 can provide pull-up (FIG. 3A) or pull-down (FIG. 3B) gate current (Igate) 103. Igate 103 can drive power device 108 and its state changes between on and off during the transition. A current Ids in FIG. 3A and FIG. 3B can be a current flowing through power switch 108. The transition time depends on gate current 103 provided by gate driver 104. Igate 103 can be controlled for good balance for the foregoing trade-off, for example, placing a current limiting resistor between gate driver 104 and power switch 108.

Figure 4A:
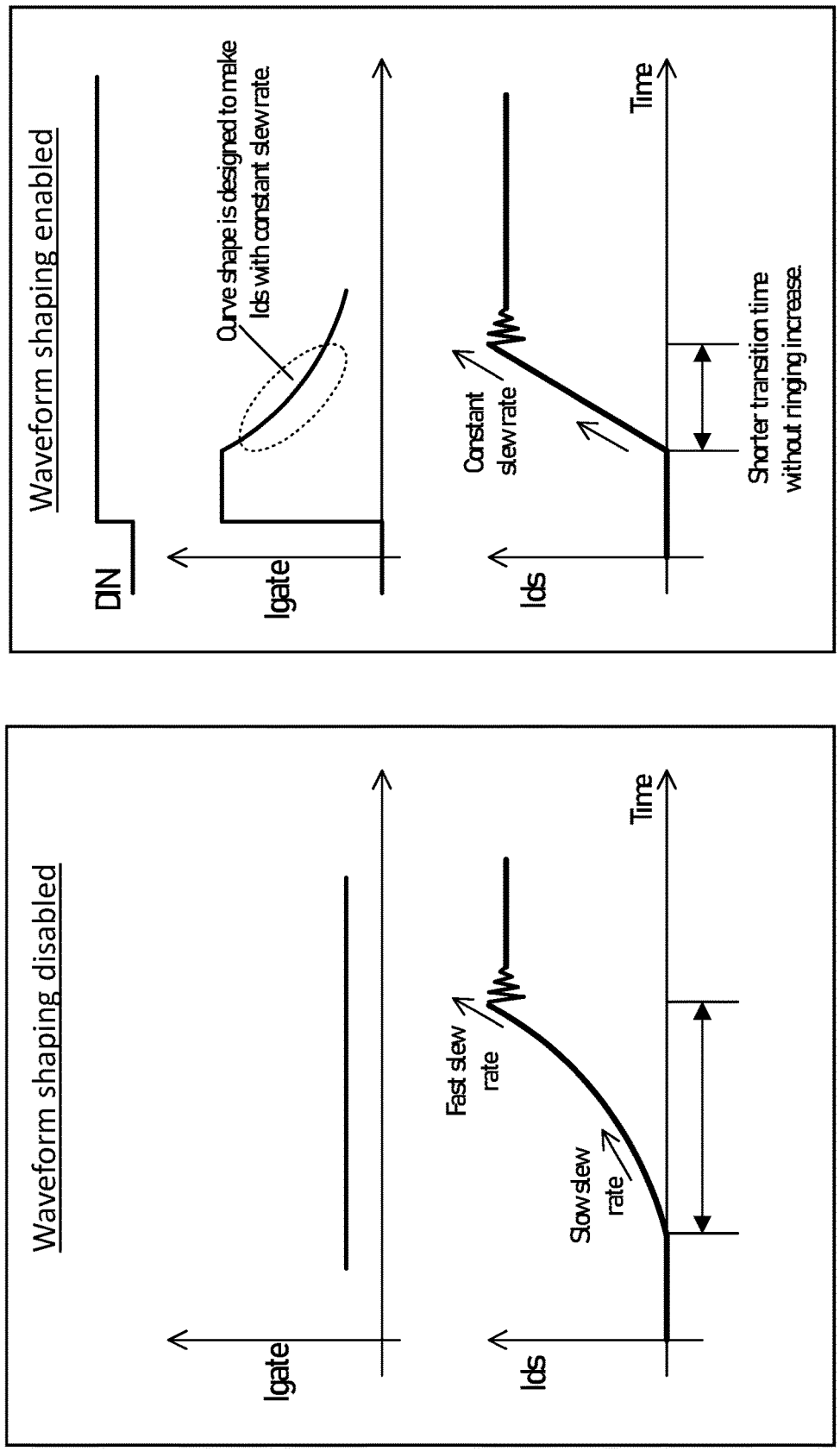
FIG. 4A is a diagram showing different scenarios where gate current shaping is disabled and enabled in one embodiment.

FIG. 4A is a diagram showing different scenarios where gate current shaping is disabled and enabled in one embodiment. As mentioned above, ringing amplitude depends on the transition time. In other words, depends on the slew rate of the power switch current such as Igate. Constant slew rate of the switch current during transition is one goal of present disclosure. The constant slew rate can result in faster transition without ringing increase, i.e., lower power loss and ringing beyond the trade-off in prior arts. Gate current shaping described herein can be applicable for small to large load current. Also, there is no need for a system to adjust the gate current depending on load current level.

For example, in embodiments where MOSFETs are used as power switches 108, the gate current can be given by: $I_{ds} \propto (V_{gs}-V_{th})^2$ where $V_{gs}=\int I_{gate} dt/C_{gs}$. If Ids is constant slew rate, then $I_{ds} \propto t$ where t is time. Based on these relationships between drain source current $I_{ds}$, time t, gate source voltage $V_{gs}$ and threshold voltage $V_{th}$, the required gate current shape (e.g., waveform shape of Igate) for turning on MOSFETs being used as power switches 108 can be expressed as: $I_{gate} \propto t^{-0.5}$. For turning on MOSFETs being used as power switches 108, the gate current shape can be mirrored in terms of time. As shown in FIG. 4A, when gate current shaping is disabled, the slew rate of gate current Igate is not constant. When gate current shaping is enabled, the slew rate of gate current Igate becomes constant. Further, as shown in FIG. 4A, the constant slew rate resulting from the gate current shaping described herein can result in shorter transition time. Various implementations in gate driver 104 to perform gate current shaping will be described in more detail below.

Figure 4B:
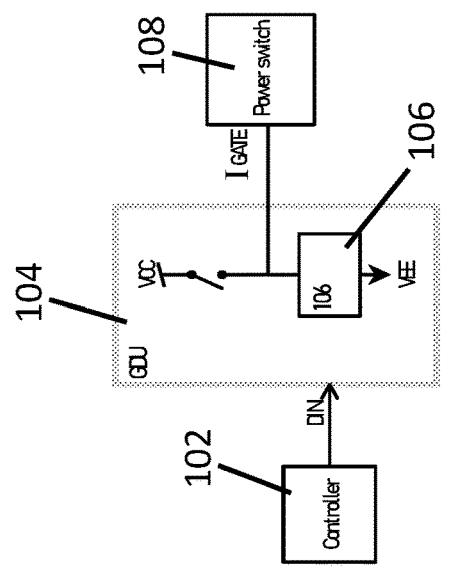
FIG. 4B is a diagram showing an implementation of gate current shaping for gate drivers in one embodiment.
Figure 4C:
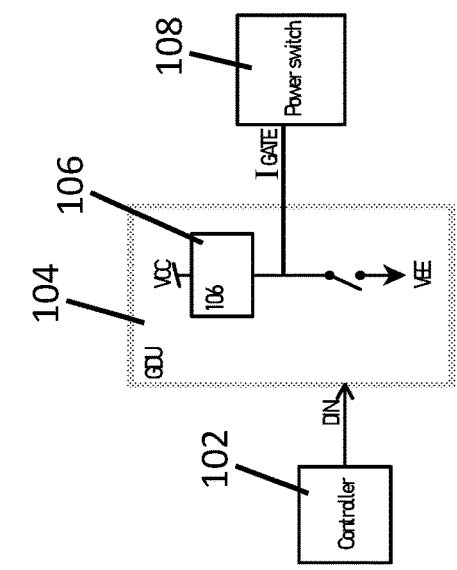
FIG. 4C is a diagram showing another implementation of gate current shaping for gate drivers in one embodiment.
Figure 4D:
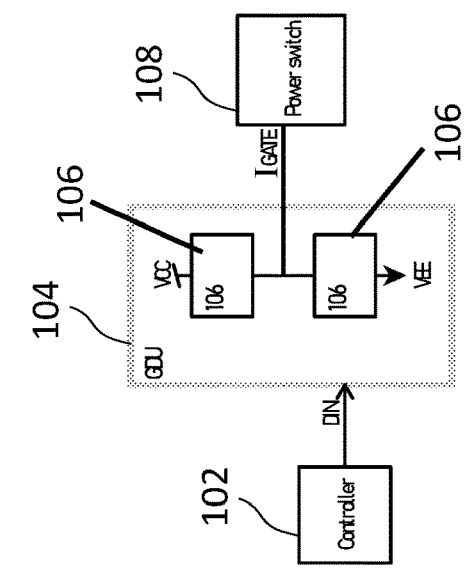
FIG. 4D is a diagram showing another implementation of gate current shaping for gate drivers in one embodiment.

FIG. 4B, FIG. 4C and FIG. 4B are diagrams showing implementations of gate current shaping for gate drivers in various embodiments. In one or more embodiments, gate driver 104 described herein can include a current shaping circuit 106. Current shaping circuit 106 can provide a curve-shaped current. In one embodiment, controller 102 can communicate with gate driver 104 to configure a waveform of signals being generated by current shaping circuit 106. In one embodiment, gate driver 104 can be configured to control waveform of signals being outputted by current shaping circuit 106. Current shaping circuit 106 can be used for pull-up and pull-down as shown in FIG. 4B, or one side only combined with pull-up/pull-down circuit as shown in FIG. 4C and FIG. 4D. In some embodiments, a system can include multiple gate drivers 104 and each one of the multiple gate drivers 104 can include different configuration of current shaping circuit 106 or implementation of current shaping circuit 106.

Figure 5A:
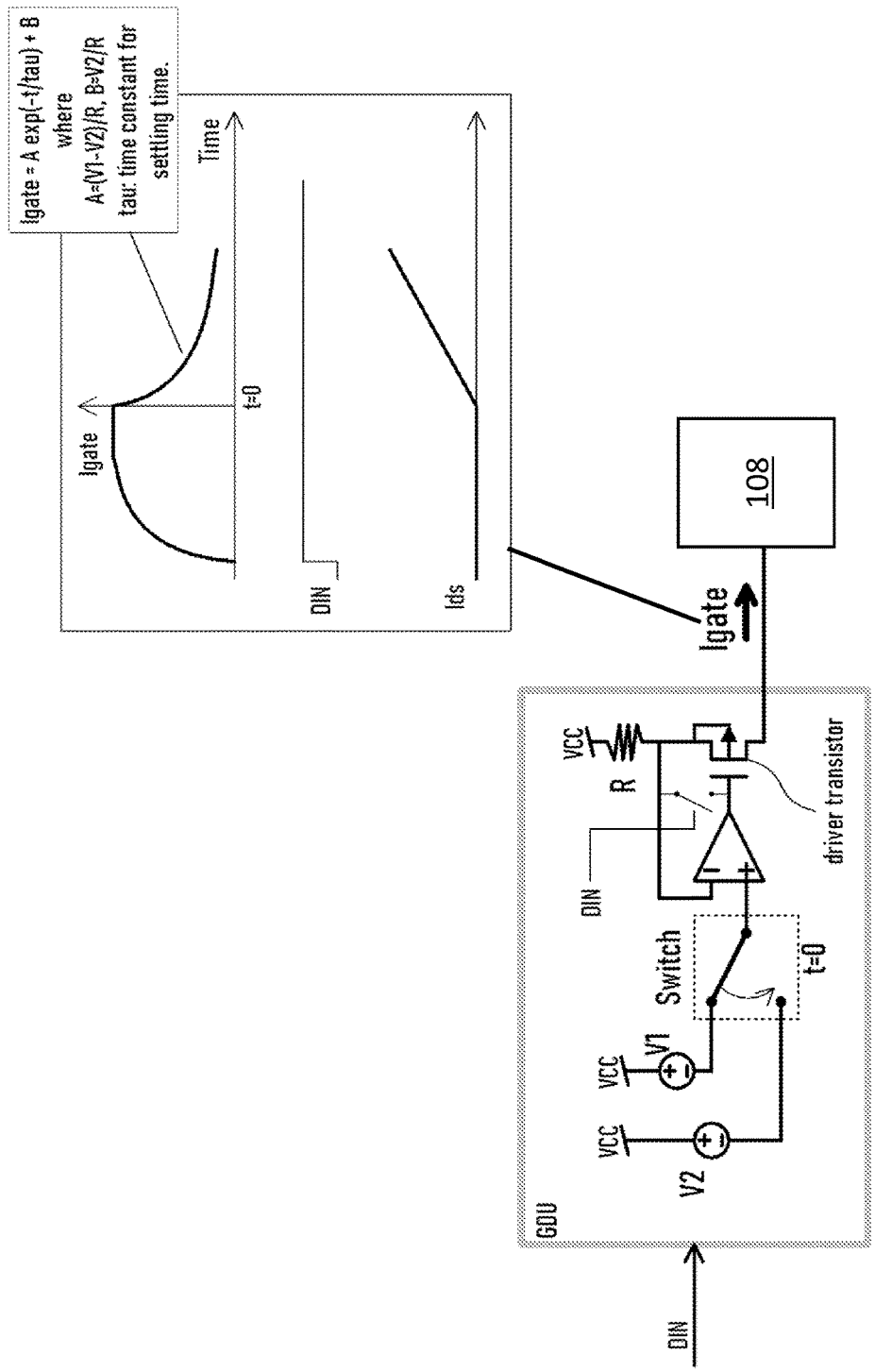
FIG. 5A is a diagram showing an example implementation of a current shaping circuit in one embodiment.

FIG. 5A is a diagram showing an example implementation of a current shaping circuit in one embodiment. In one embodiment, current shaping circuit 106 can generate a curve shape for Igate by performing interpolation of two signal levels using a settling of an operational amplifier. In an example embodiment in FIG. 5A, current shaping circuit 106 can include voltage references V1 and V2, an operational amplifier 502, at least a resistor R, and a driver transistor M1. Driver transistor M1 can be turned off (e.g., transition from on to off) while a data-in signal (DIN) is low. At first when DIN gets high (e.g., transition from off toon), current shaping circuit 106 can generate output current as: $I_{gate}=V_1/R$. After a certain time, switch 501 alters the non-inverting input of 502. Say this time point as "t=0", then the output current is given as: $I_{gate}=A \exp(-t/t)+B$ where $A=(V_1-V_2)/R$, $B=V_2/R$. The waveform shape of Igate can be configured by parameters such as: $V_1$, $V_2$, R, τ. In one embodiment, the timing of t=0 can be generated by a delay circuit from DIN. In another embodiment, the timing can be generated by the GATE voltage i.e., a comparator can detect the GATE voltage exceeds the threshold of 108 where 108 starts to flow the switch current Ids. In another embodiment, the timing can be generated by current sensing described later.

Figure 5B:
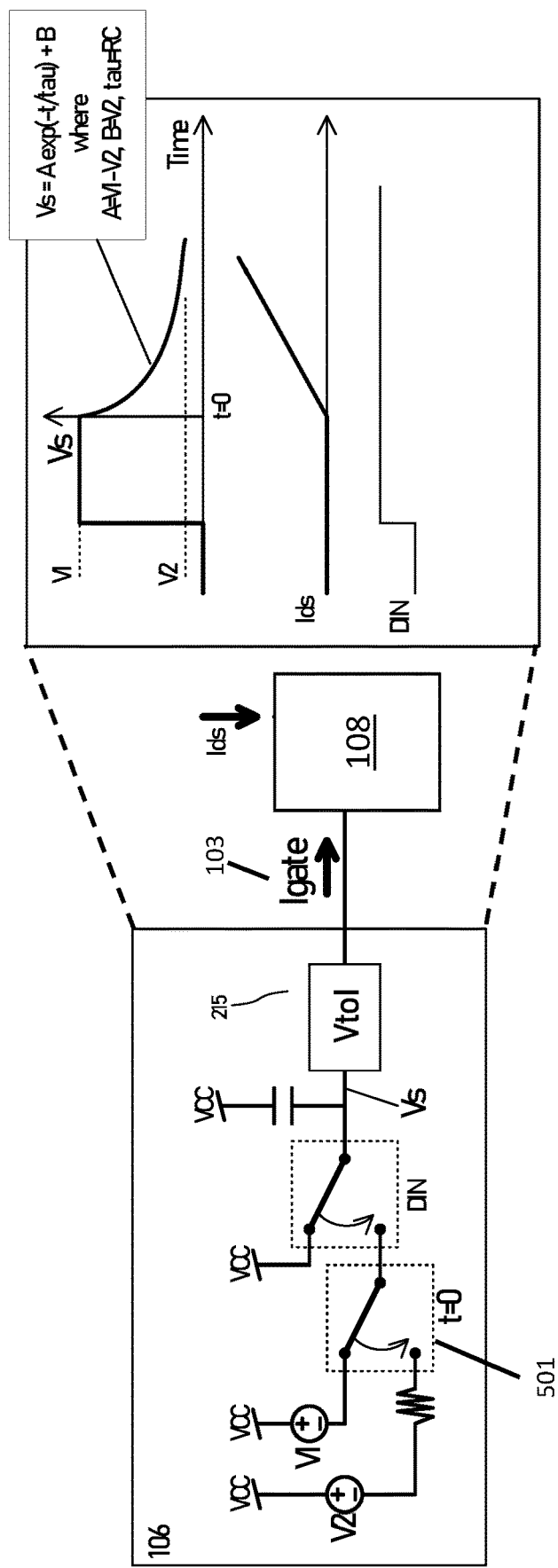
FIG. 5B is a diagram showing another example implementation of a current shaping circuit in one embodiment.

FIG. 5B is a diagram showing another example implementation of a current shaping circuit in one embodiment. In one embodiment, current shaping circuit 106 can generate a curve shape for Igate by performing interpolation of two signal levels using a settling of an R-C circuit. Current shaping circuit 106 can include voltage references V1 and V2, a voltage to current converter 215, switch circuits to alter the input voltage Vs for 215 and R-C components as illustrated. The operation can be the same as the embodiment shown in FIG. 5A. At t=0, Vs start to change from V1 to V2 and C and R placed between V2 to C define the settling time, which creates curve shape as: $V_s=A \exp(-t/\tau)+B$ where $A=V_1-V_2$, $B=V_2$, $\tau=RC$. Output current Igate can be proportional to Vs in one embodiment. In other embodiments, Igate can get further modulation depending on the transfer function of voltage to current converter 215.

Figure 5C:
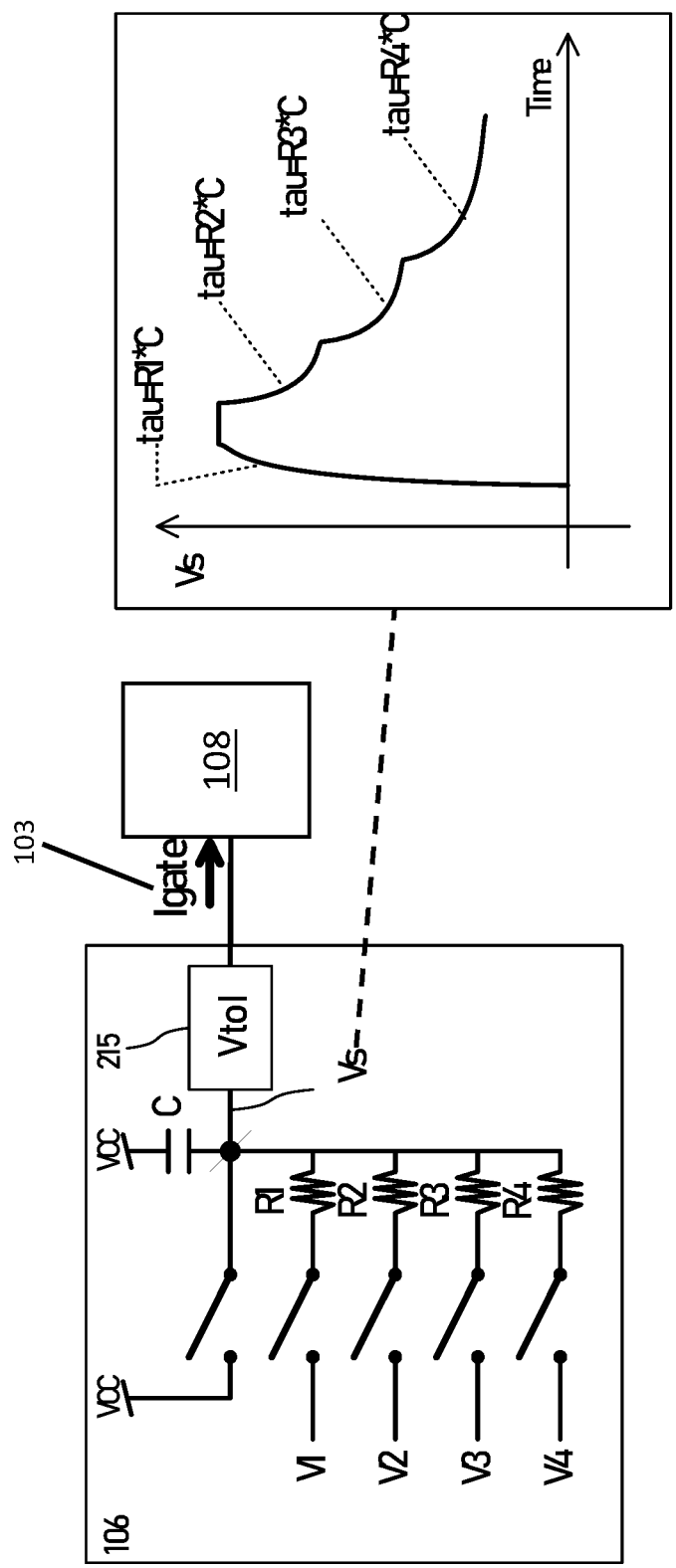
FIG. 5C is a diagram showing another example implementation of a current shaping circuit in one embodiment.

FIG. 5C is a diagram showing another example implementation of a current shaping circuit in one embodiment. In one embodiment, current shaping circuit 106 can generate a curve shape for Igate by performing interpolation of multiple signal levels using a settling of an R-C circuit. Current shaping circuit 106 can include voltage references V1, V2 and so on, a voltage to current converter 215, switch circuits to alter the input voltage Vs for voltage to current converter 215 and R-C components as illustrated. The operation can be the same as the embodiment in FIG. 5B. By concatenating multiple curves, a relatively complex curve shape can be generated as illustrated.

Figure 5D:
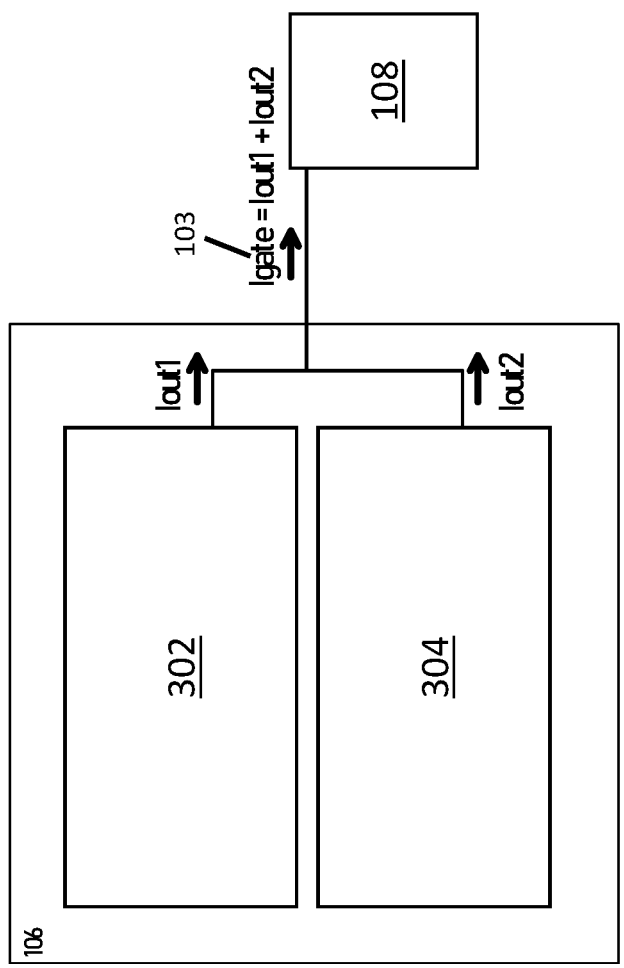
FIG. 5D is a diagram showing another example implementation of a current shaping circuit in one embodiment.

FIG. 5D is a diagram showing another example implementation of a current shaping circuit in one embodiment. The embodiment in FIG. 5D can provide relatively more complex or precise configuration on the curve shape by combination of multiple current shaping circuits. Multiple segments 302 and 304 of current shaping circuits e.g., any embodiments in FIG. 5A to FIG. 5C can be implemented in the embodiment shown in FIG. 5D.

Figure 5E:
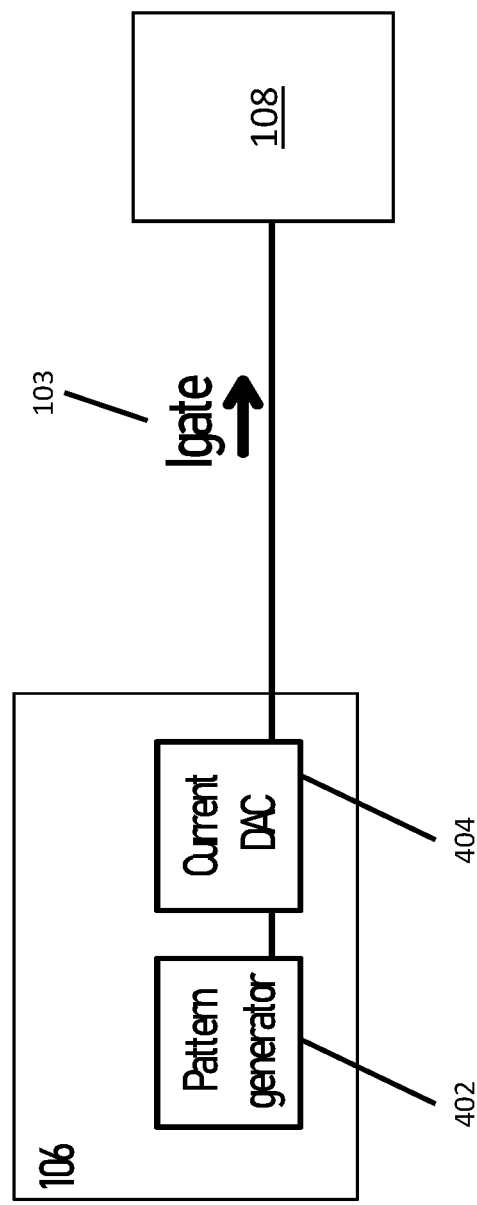
FIG. 5E is a diagram showing another example implementation of a current shaping circuit in one embodiment.

FIG. 5E is a diagram showing another example implementation of a current shaping circuit in one embodiment. Current sharing circuit 106 can include a digital pattern generator 402 and a current digital-to-analog converter 404. The output current Igate can be configured to any curve shape.

Figure 5F:
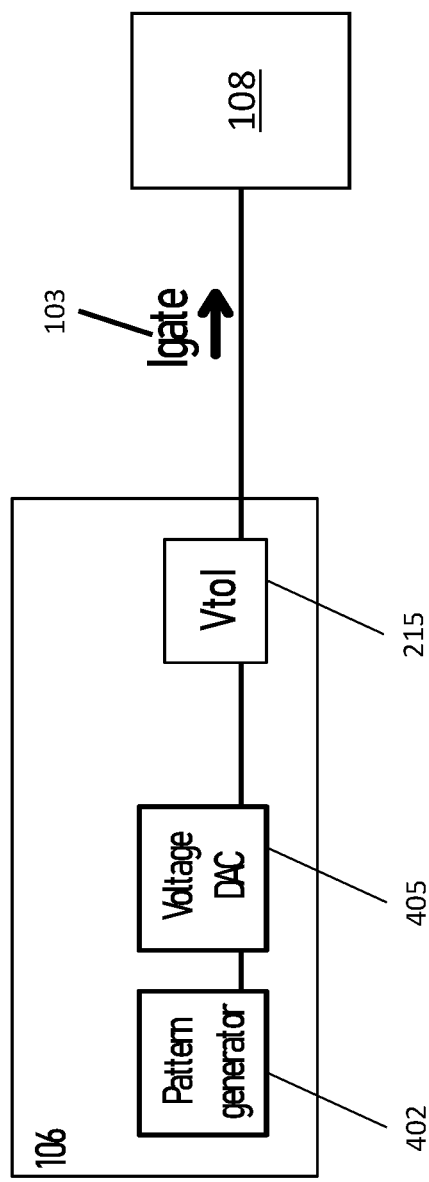
FIG. 5F is a diagram showing another example implementation of a current shaping circuit in one embodiment.

FIG. 5F is a diagram showing another example implementation of a current shaping circuit in one embodiment. Current shaping circuit 106 can include a digital pattern generator 402, a voltage to current converter 215 and a voltage digital-to-analog converter 404. The output current Igate can be configured to any curve shape.

Figure 6A:
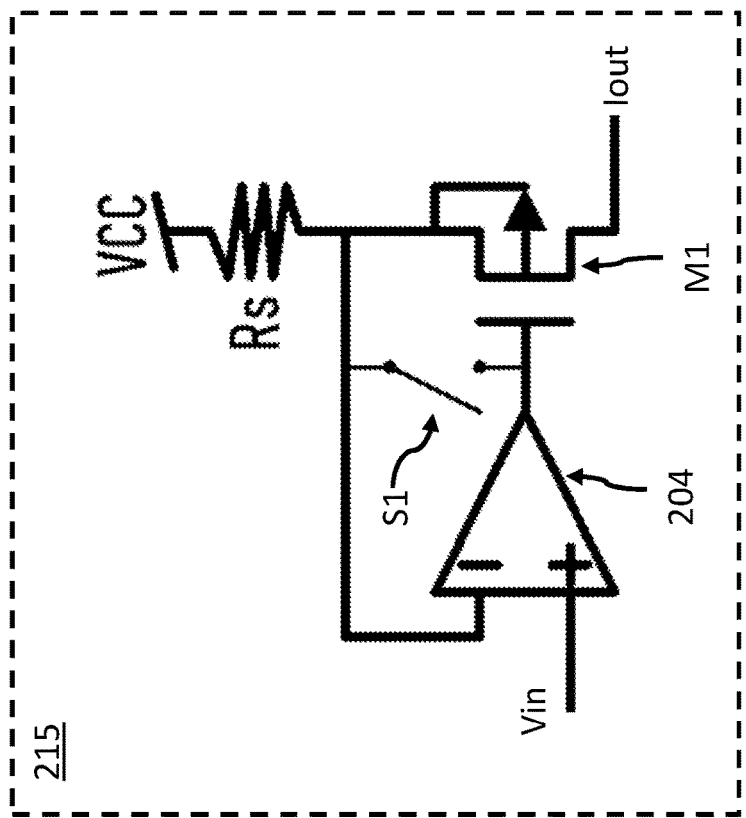
FIG. 6A is a diagram showing an example implementation of a voltage to current converter that can be used for current shaping circuit for gate drivers in one embodiment.

FIG. 6A is a diagram showing an example implementation of a voltage to current converter that can be used for current shaping circuit for gate drivers in one embodiment. Current shaping circuit 106 can include various implementations of a voltage to current converter 215. In an example shown in FIG. 6A, voltage to current converter 215 can comprise of a high speed operational amplifier 204, a MOSFET M1 and resistor Rs (see M1 and R in FIG. 5A). Note that operational amplifier 204 can be configured to operate relatively faster than operational amplifier 502. The output current is given as: $I_{out}=V_{in}/R_s$. Voltage to current converter 215 can further include a switch S1 to turn M1 off quickly.

Figure 6B:
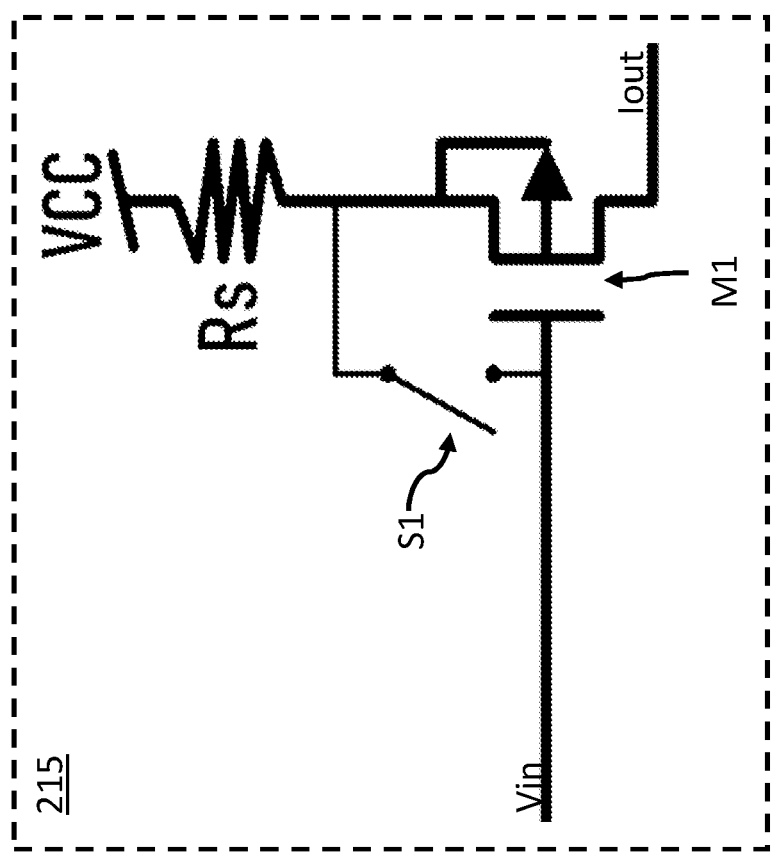
FIG. 6B is a diagram showing another example implementation of a voltage to current converter that can be used for gate current shaping circuit in one embodiment.

FIG. 6B is a diagram showing another example implementation of a voltage to current converter that can be used for current shaping circuit for gate drivers in one embodiment. In another example shown in FIG. 6B, voltage to current converter 215 can comprise of a MOSFET M1 and resistor Rs. In addition, voltage to current converter 215 can further include a switch S1 to turn M1 off quickly. The output current is given as: $I_{out}=(V_{in}-V_{th})/R_s$ where $V_{th}$ is threshold voltage of M1.

Figure 6C:
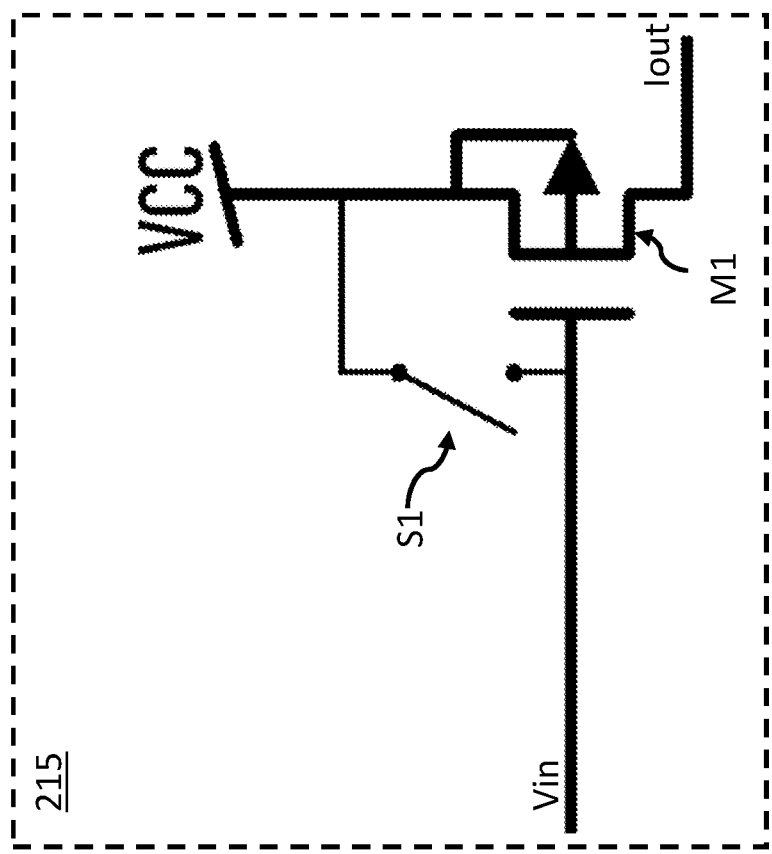
FIG. 6C is a diagram showing another example implementation of a voltage to current converter that can be used for gate current shaping circuit in one embodiment.

FIG. 6C is a diagram showing another example implementation of a voltage to current converter that can be used for current shaping circuit for gate drivers in one embodiment. In another example shown in FIG. 6C, voltage to current converter 215 can comprise of a MOSFET M1. In addition, voltage to current converter 215 can further include a switch S1 to turn M1 off quickly. The output current is given as: $I_{out}=K(V_{in}-V_{th})^2$ where K is a parameter depend on M1.

Figure 7:
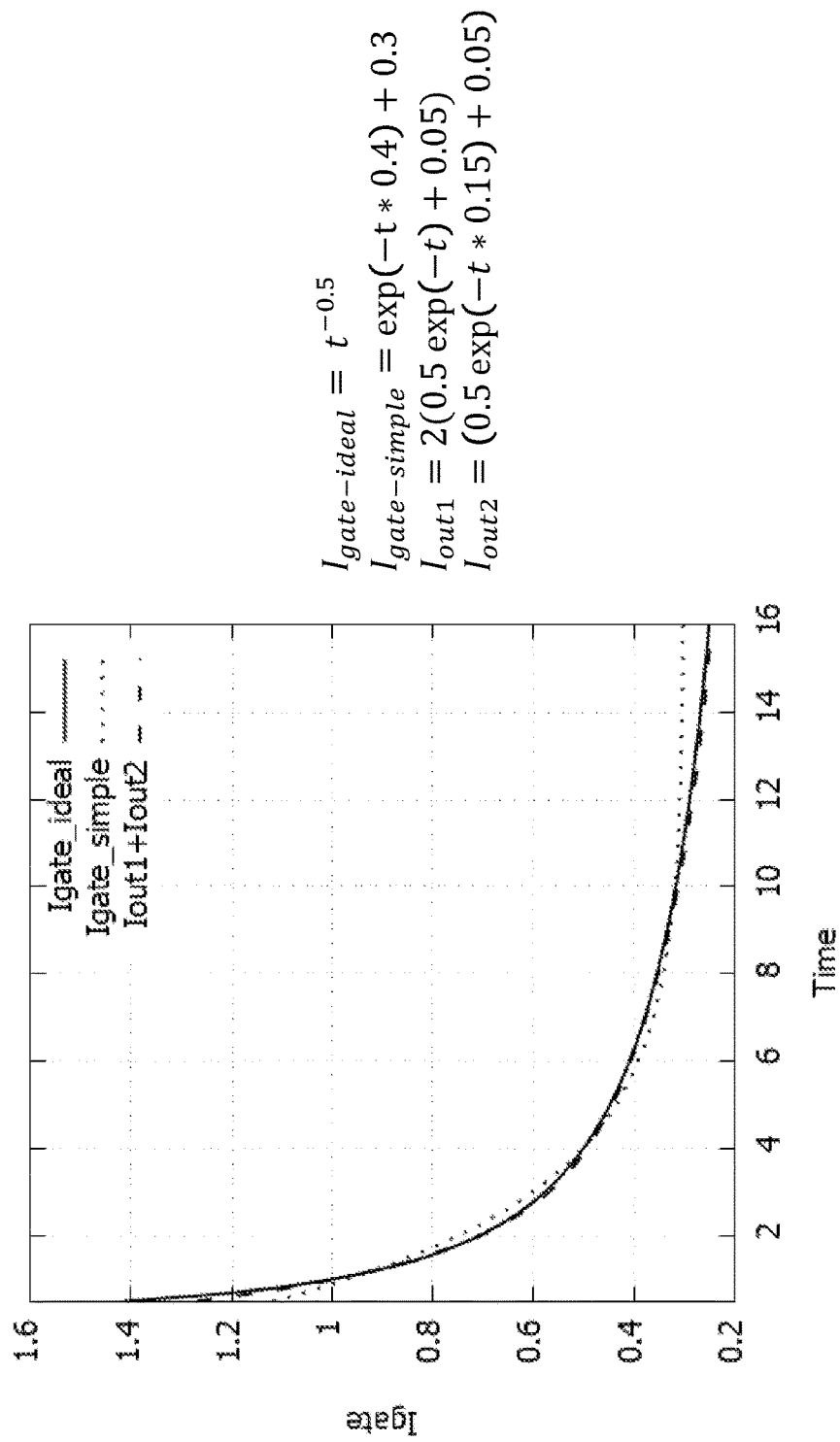
FIG. 7 is a diagram showing different waveforms having different shapes as a result of implementations of current shaping circuit for gate drivers in one or more embodiments.

FIG. 7 is a diagram showing different waveforms having different shapes as a result of implementations of current shaping circuit for gate drivers in one or more embodiments. In FIG. 7, the waveform labeled as Igate_simple is a waveform resulting from implementations of the embodiments in FIG. 5A and FIG. 5B. The waveform labeled as Iout1+Iout2 is a waveform resulting from the implementation of the embodiment in FIG. 5C, which is closer to the ideal curve and better result can be expected i.e., lower loss and lower ringing.

Figure 8B:
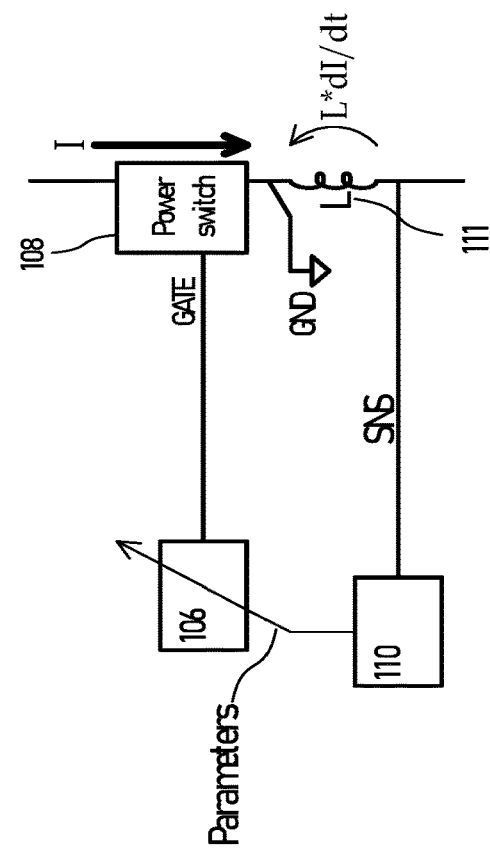
FIG. 8B is a diagram showing another system with adaptive control on gate current shaping in one embodiment.
Figure 8A:
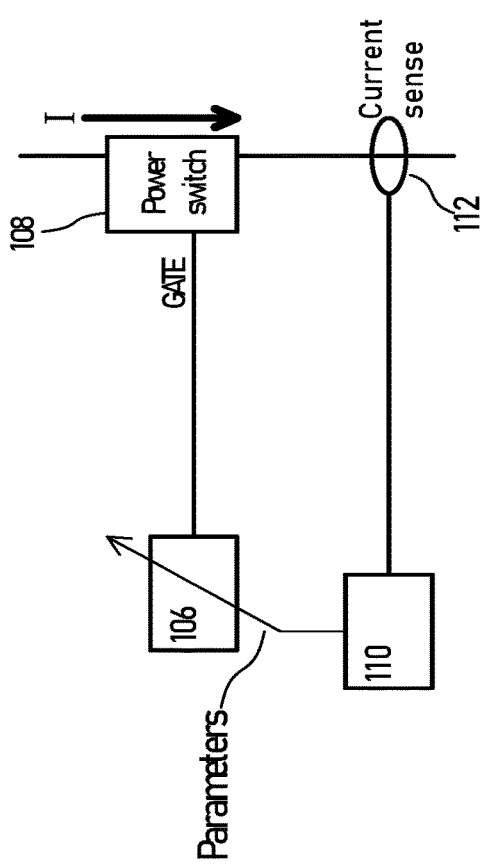
FIG. 8A is a diagram showing a system with adaptive control on gate current shaping in one embodiment.

FIG. 8A and FIG. 8B are diagrams showing systems with adaptive control on gate current shaping in one or more embodiments. Gate current shape being shaped by current shaping circuit 106 can be, and not limited to, any current shaping circuit implementations as seen above. The system can also have feedback control from a sensing circuit 110. In FIG. 8A, the system can include a current sensor 112 and makes feedback by observing the slew rate of the current in power switch 108. Sensing circuit 110 can configure current shaping circuit 106 to make constant slew rate of the switch current during transition. Sensing circuit 110 can know the slew rate of current by calculation: dI/dt. Sensing circuit 110 can also optimize the gate current shaping to get better results. Also, sensing current 110 can detect when the switch current start flowing for the timing generation of current shaping circuit 106. In FIG. 8B, current sensor 112 can be implemented by an inductor 111. Inductor 111 is in series with power switch 108. In one embodiment, inductor 111 can have a stray inductance L of current path from power switch 108 to sensing circuit 110. In another embodiment, power switch 108 can include inductor 111. Voltage at SNS is slew rate of the switch current given as: SNS=−L dI/dt. The control method is the same as the implementation shown in FIG. 8A.

FIG. 9A, FIG. 9B and FIG. 9C are diagrams showing different implementations of feedback control in one or mode embodiments. In FIG. 9A, the waveform shape of gate current Igate is ideal. In FIG. 9B, the waveform shape of gate current Igate is relatively steep. In FIG. 9C, the waveform shape of gate current Igate is relatively flat. SNS is a voltage shown in FIG. 8B. As illustrated by dotted circles, time or amplitude in the dotted circles or following ringing amplitude can indicate whether the curve in the waveforms shapes of Igate is steep or flat. Thus, the system can optimize the curve by changing the parameter of current shaping circuit 106 such as "tau" in FIG. 5A and FIG. 5B.

Figure 10:
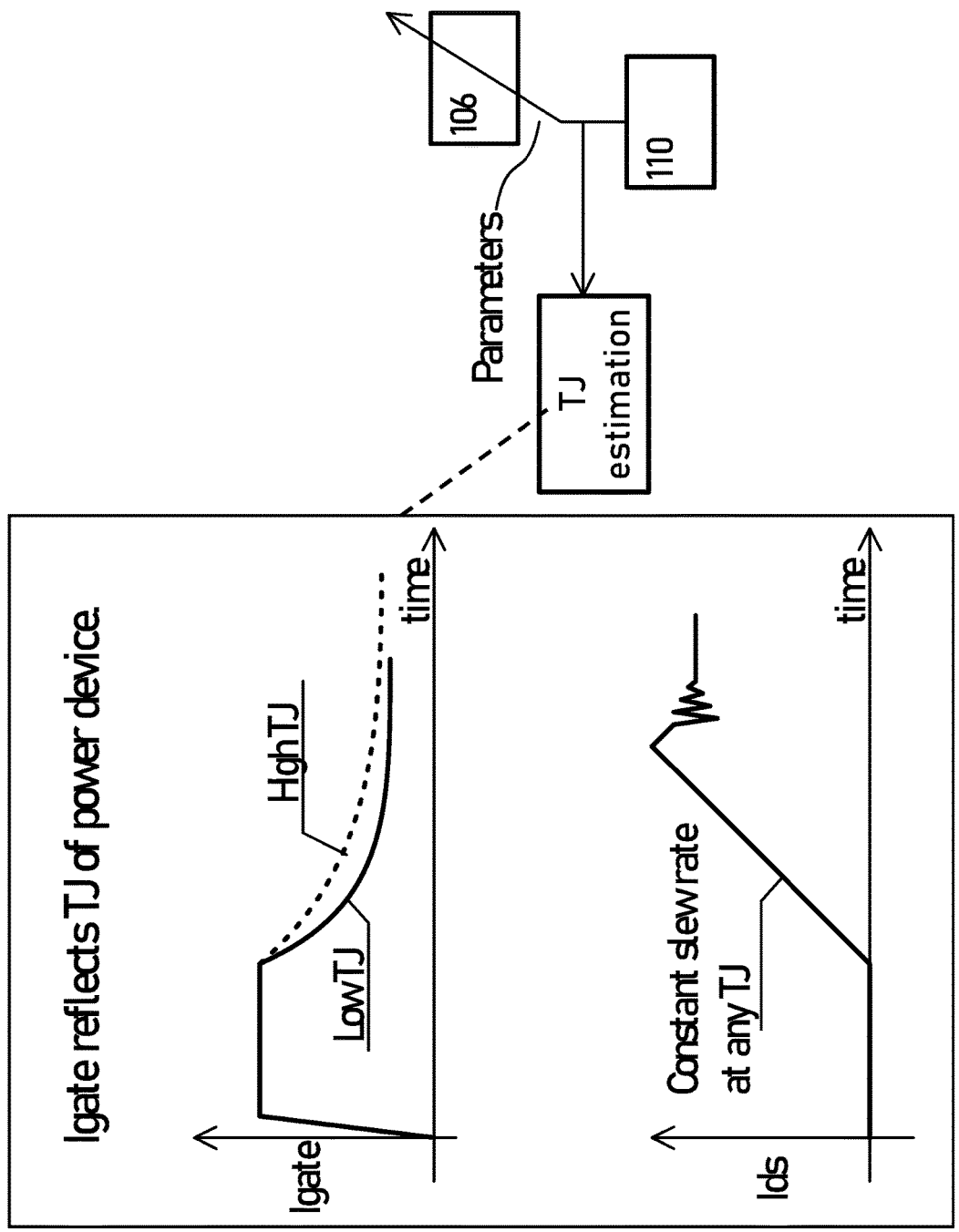
FIG. 10 is a diagram showing an implementation where temperature estimation is utilized in one embodiment.

FIG. 10 is a diagram showing an implementation where temperature estimation is utilized in one embodiment. In general, characteristics of power switch 108 varies by its junction temperature TJ i.e., the best gate current shape is slightly different by TJ. If a system is optimizing gate current shaping, the resulting gate current shape reflects TJ. Therefore, TJ can be estimated by gate current shape i.e., parameters of current shaping circuit 106. TJ estimation can be used for safety purposes in a system.

FIG. 11 illustrates a flow diagram of a process to implement gate current shaping for gate drivers in one embodiment. The process can include one or more operations, actions, or functions as illustrated by one or more of blocks 1102 and/or 1104. Although illustrated as discrete blocks, various blocks can be divided into additional blocks, combined into fewer blocks, eliminated, performed in different order, or performed in parallel, depending on the desired implementation.

Process 1100 can be performed by, for example, the driver (e.g., driver 104) and the waveform shaping circuits (e.g., circuit 106) described herein. Process 1100 can begin at block 1102. At block 1102, a gate driver can generate a gate current for driving a power switch. Process 1100 can proceed from block 1102 to block 1104. At block 1104, the gate driver can define a waveform shape of the gate current, where the defined waveform shape of the gate current causes a current of the switch to have a constant slew rate during transition of the power switch.

In one embodiment, the gate driver can sense current at the power switch and execute a feedback loop to optimize the waveform shape of the gate current based on the sensed current. In one embodiment, the gate driver can use the waveform shape of the gate current to estimate a junction temperature of the power switch.

In one embodiment, the gate driver can generate digital signals including a digital pattern that represents the waveform shape of the gate current and convert the digital signals into an analog signal that defines the waveform shape of the gate current.

In one embodiment, the gate driver can output the gate current at a first amplitude. The gate driver can further switch an operational amplifier to output the gate current at a second amplitude. The operational amplifier can define the waveform shape of the gate current and the waveform shape of the gate current depends a settling speed of the operational amplifier.

In one embodiment, the gate driver can use at least one voltage source to generate a voltage and use a resistor-capacitor (RC) network to change the voltage generated by the voltage source, where the waveform shape of the gate current can be defined by the RC network The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a driver circuit configured to drive a switch, wherein the driver circuit comprises:
   a circuit configured to, at a transition of the switch, generate a gate current having a defined waveform shape, wherein the defined waveform shape of the gate current causes a current of the switch to have a constant slew rate during transition of the switch, wherein the circuit comprises:
      a pattern generator configured to generate digital signals including a digital pattern that represents the waveform shape of the gate current; and
      a digital-to-analog converter (DAC) configured to convert the digital signals into an analog signal that defines the waveform shape of the gate current.

2. The semiconductor device of claim 1, further comprising a sense circuit configured to:
sense current at the switch; and
execute a feedback loop to optimize the waveform shape of the gate current based on the sensed current.

3. The semiconductor device of claim 2, further comprising:
a junction temperature circuit configured to use the waveform shape of the gate current to estimate a junction temperature of the switch.

4. A system comprising:
at least one power switch; and
a gate driver configured to:
   drive the at least one power switch;
   at a transition of the at least one power switch, generate a gate current having a defined waveform shape, wherein the defined waveform shape of the gate current causes a current of the switch to have a constant slew rate during transition of the at least one power switch,
wherein the gate driver comprises:
   a pattern generator configured to generate digital signals including a digital pattern that represents the waveform shape of the gate current; and
   a digital-to-analog converter (DAC) configured to convert the digital signals into an analog signal that defines the waveform shape of the gate current.

5. The system of claim 4, further comprising a sense circuit configured to:
sense current at the at least one power switch; and
execute a feedback loop to optimize the waveform shape of the gate current based on the sensed current.

6. The system of claim 5, further comprising:
a junction temperature circuit configured to use the waveform shape of the gate current to estimate a junction temperature of the at least one power switch.

7. A method for a gate driver, the method comprising:
generating a gate current for driving a power switch;
at a transition of the switch, defining a waveform shape of the gate current, wherein the defined waveform shape of the gate current causes a current of the power switch to have a constant slew rate during transition of the power switch;
generating digital signals including a digital pattern that represents the waveform shape of the gate current; and
converting the digital signals into an analog signal that defines the waveform shape of the gate current.

8. The method of claim 7, further comprising:
sensing current at the power switch; and
executing a feedback loop to optimize the waveform shape of the gate current based on the sensed current.

9. The method of claim 8, further comprising:
using the waveform shape of the gate current to estimate a junction temperature of the power switch.

* * * * *